(12) United States Patent
Yeo et al.

(10) Patent No.: US 7,579,135 B2
(45) Date of Patent: Aug. 25, 2009

(54) LITHOGRAPHY APPARATUS FOR MANUFACTURE OF INTEGRATED CIRCUITS

(75) Inventors: Yee-Chia Yeo, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 650 days.

(21) Appl. No.: 10/826,602

(22) Filed: Apr. 16, 2004

(65) Prior Publication Data

US 2005/0036184 A1 Feb. 17, 2005

Related U.S. Application Data

(60) Provisional application No. 60/494,154, filed on Aug. 11, 2003, provisional application No. 60/498,195, filed on Aug. 25, 2003.

(51) Int. Cl.
*G03F 7/20* (2006.01)
*G03F 7/26* (2006.01)

(52) U.S. Cl. ................ 430/311; 430/322

(58) Field of Classification Search ........ 430/311, 430/961, 322
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 4,509,852 A | 4/1985 | Tabarelli et al. | |
| 5,121,256 A | 6/1992 | Corle et al. | |
| 5,610,683 A | 3/1997 | Takahashi | |
| 5,715,039 A | 2/1998 | Fukuda et al. | |
| 5,900,354 A | 5/1999 | Batchelder | |
| 7,176,522 B2 * | 2/2007 | Cheng et al. | 257/338 |
| 2002/0031319 A1 * | 3/2002 | Wang | 385/125 |
| 2002/0039704 A1 * | 4/2002 | Din et al. | 430/313 |
| 2002/0163629 A1 | 11/2002 | Switkes et al. | |
| 2003/0174408 A1 | 9/2003 | Rostalski et al. | |
| 2004/0038556 A1 | 2/2004 | French et al. | |
| 2004/0175647 A1 | 9/2004 | French et al. | |
| 2005/0007570 A1 | 1/2005 | Streefkerk et al. | |
| 2005/0018208 A1 | 1/2005 | Levinson | |

(Continued)

OTHER PUBLICATIONS

Hoffnagle, J.A., et al., "Liquid Immersion Deep-Ultraviolet Interferometric Lithography," J. Vaccum Science and Technology B, 1999 American Vacuum Society, vol. 17, No. 6, pp. 3306-3309, Nov./Dec. 1999.

(Continued)

*Primary Examiner*—Kathleen Duda
*Assistant Examiner*—Brittany Raymond
(74) *Attorney, Agent, or Firm*—Slater & Matsil, L.L.P.

(57) ABSTRACT

An immersion lithographic system 10 comprises an optical surface 51, an immersion fluid 60 contacting at least a portion of the optical surface, and a semiconductor structure 80 having a topmost photoresist layer 70 having a thickness of less than about 5000 angstroms, wherein a portion of the photoresist is in contact with the immersion fluid. Further, a method for illuminating a semiconductor structure 80 having a topmost photoresist layer 70 with a thickness of less than about 5000 angstroms, comprising introducing an immersion fluid 60 into a space between an optical surface 51 and the photoresist layer, and directing light preferably with a wavelength of less than about 450 nm through the immersion fluid and onto the photoresist.

30 Claims, 8 Drawing Sheets

U.S. PATENT DOCUMENTS

| | | |
|---|---|---|
| 2005/0037269 A1* | 2/2005 | Levinson ..................... 430/30 |
| 2005/0078286 A1 | 4/2005 | Dierichs et al. |
| 2005/0084794 A1* | 4/2005 | Meagley et al. .......... 430/270.1 |
| 2005/0123863 A1* | 6/2005 | Chang et al. ................ 430/322 |
| 2005/0164502 A1 | 7/2005 | Deng et al. |
| 2005/0164522 A1 | 7/2005 | Kunz et al. |
| 2005/0186513 A1 | 8/2005 | Letz et al. |
| 2005/0266683 A1* | 12/2005 | Lee ............................ 438/638 |
| 2006/0072088 A1 | 4/2006 | Lipson et al. |
| 2006/0141400 A1* | 6/2006 | Hirayama et al. ........... 430/395 |
| 2006/0154171 A1* | 7/2006 | Hirayama et al. ........ 430/270.1 |
| 2006/0154188 A1 | 7/2006 | Hirayama et al. |
| 2007/0046915 A1 | 3/2007 | Streefkerk et al. |
| 2007/0091288 A1* | 4/2007 | Lin et al. ...................... 355/30 |

OTHER PUBLICATIONS

Switkes, M., et al., Immersion Lithography at 157 nm, J. Vacuum Science and Technology B, 2001 American Vacuum Society, vol. 19, No. 6, pp. 2353-2356, Nov./Dec. 2001.

Casiday, R., et al., "Water Hardness—Inorganic Reactions Experiment," 1998, 4 pgs., Washington University.

Brown, T.L., et al., "Chemistry: The Central Science," 1997, pp. 574-577, 7th Ed., Prentice Hall, Inc., Upper River Saddle, New Jersey.

* cited by examiner

LITHOGRAPHY APPARATUS FOR MANUFACTURE OF INTEGRATED CIRCUITS

CROSS-REFERENCE TO RELATED APPLICATIONS

This application claims priority based on U.S. Provisional Patent Application Ser. No. 60/494,154, filed Aug. 11, 2003, entitled "Lithography Apparatus for Manufacture of Integrated Circuits". The provisional application is incorporated herein by reference in its entirety.

This application claims priority to U.S. Provisional Application Ser. No. 60/498,195, filed Aug. 25, 2003, entitled "Immersion Fluid for Immersion Lithography, and Method of Performing Immersion Lithography". The application is incorporated herein by reference in its entirety.

TECHNICAL FIELD

The present invention relates generally to the fabrication of semiconductor devices, and more specifically, to immersion lithographic systems that employ an immersion fluid between a final optic and a substrate.

BACKGROUND

In photolithographic systems, there is a need to achieve a high resolution in order to resolve high-resolution patterns, such as images, lines, or spots. In a photolithographic system employed in the integrated circuit (IC) industry, light is projected onto a resist for the purpose of patterning an electronic device. Photolithographic systems have been used in the IC industry for many decades and are expected to resolve line widths of 50 nm and below in the future. Significant improvement in the resolution of photolithographic systems has been one of the most important enablers for the manufacture of high density and high speed semiconductor IC chips.

The resolution R of a photolithographic system for a given lithographic constant $k_1$, is given by $R=k_1 \lambda/NA$, where $\lambda$ is the operational wavelength, and the numerical aperture NA is given by the $NA=n \sin \theta$. Angle $\theta$ is the angular semi-aperture of the system, and n is the index of the material filling the space between the system and the substrate to be patterned.

There are three trends that are conventionally employed to effect resolution improvement in photolithographic technology. First, the wavelength $\lambda$ has been progressively reduced from the mercury G-line (436 nm) to the ArF excimer laser line (193 nm), and further to 157 nm and possibly into the extreme-ultraviolet (EUV) wavelengths. Second, the implementation of resolution enhancement techniques such as phase-shifting masks and off-axis illumination have led to a reduction in the lithographic constant $k_1$ from about 0.6 to about 0.4. Third, the numerical aperture NA has been increased from about 0.35 to about 0.8 with improvements in optical designs, manufacturing techniques, and metrology. However, these conventional techniques of improving the resolution are approaching physical and technical limits. For example, the value of NA, i.e. n sin θ, is limited by the value of n. If free-space optical systems are used, where the value of n is unity, the value of NA has an upper bound of unity.

Recently, immersion lithography has been developed which allows NA to be further increased. In immersion lithography, a substrate to be patterned is immersed in a high-index fluid or an immersion medium, such that the space between the final optical element or lens and the substrate is filled with a high-index fluid (n>1). In this way, the lens can be designed to have NA larger than 1. High-index fluids such as perfluoropolyether (PFPE), cyclo-octane, and de-ionized water may be used. Since the value of NA can be further increased, immersion lithography therefore offers better resolution enhancement over conventional lithography. The high-index fluid should satisfy several requirements: it should have a low absorption for the wavelength being used; its index of refraction should be reasonably high to make the index modification worth its while, and it should be chemically compatible with the photoresist on the substrate as well as the optical element and the coatings that the fluid contacts.

Since immersion lithography involves the use of photoresist materials immersed in an immersion fluid, the immersion fluid should preferably not interact with or degrade the photoresist material. However, conventional immersion fluids typically do interact with or degrade photoresists. It is an object of this invention to provide a method for performing immersion lithography without severe degradation of photoresist materials.

In certain prior art schemes of performing immersion lithography where water is used as the immersion fluid, the photoresist is immersed in water. Photoresist materials when immersed in water potentially swell and increase in thickness. It is an object of this invention to provide a method of performing immersion lithography, which limits the amount of swelling of the photoresist.

The following references are related to aspects of the preferred embodiments and are herein incorporated by reference in their entirety.

[1] M. Switkes et al., "Methods and apparatus employing an index matching medium," U.S. Patent Application Publication No. US 2002/0163629.

[2] J. S. Batchelder, "Method for optical inspection and lithography," U.S. Pat. No. 5,900,354.

[3] K. Takahashi, "Immersion type projection exposure apparatus," U.S. Pat. No. 5,610,683.

[4] T. R. Corle et al., "Lithography system employing a solid immersion lens," U.S. Pat. No. 5,121,256.

[5] J. A. Hoffnagle et al., "Liquid immersion deep-ultraviolet interferometric lithography," *J. Vacuum Science and Technology B*, vol. 17, no. 6, pp. 3306-3309, 1999.

[6] M. Switkes et al., "Immersion lithography at 157 nm," *J. Vacuum Science and Technology B*, vol. 19, no. 6, pp. 2353-2356, 2000.

[7] W. Tabarelli et al., "Photolithographic method for the manufacture of integrated circuits," U.S. Pat. No. 4,346,164.

[8] W. Tabarelli et al., "Apparatus for the photolithographic manufacture of integrated circuit elements," U.S. Pat. No. 4,509,852.

[9] A. Takanashi et al., "Pattern forming apparatus," U.S. Pat. No. 4,480,910.

[10] J. S. Batchelder, "Method for optical inspection and lithography," U.S. Pat. No. 5,900,354.

[11] K. Takahashi, "Immersion type projection exposure apparatus," U.S. Pat. No. 5,610,683.

SUMMARY OF THE INVENTION

The preferred embodiment relates to the field of lithographic systems, and more specifically, to immersion lithographic systems that employ an immersion fluid between a final optic and a substrate. In one aspect, the invention teaches a method for performing immersion lithography without severe degradation of the photoresist materials.

In accordance with another preferred embodiment of the present invention, an immersion lithographic system comprises an optical surface, an immersion fluid contacting at least a portion of the optical surface, and a semiconductor structure having a topmost layer of photosensitive material with at least a portion of the photosensitive material being in contact with immersion fluid, wherein the photosensitive material has a thickness of less than 5000 angstroms.

In accordance with another preferred embodiment of the present invention, a method of performing immersion lithography limits the amount of swelling of the photoresist.

In accordance with yet another preferred embodiment of the present invention, a method for illuminating a semiconductor structure having a topmost photoresist layer comprises the steps of introducing an immersion fluid into a space between an optical surface and the photoresist layer, with the photoresist layer having a thickness of less than 5000 angstroms, and directing optical energy through the immersion fluid and onto the photoresist.

In accordance with yet another preferred embodiment of the present invention, a semiconductor fabricating process for an immersion lithography system comprises the steps of providing a semiconductor structure with a topmost photoresist layer with the photoresist layer having a thickness of less than 5000 angstroms, introducing water into a space between an optical surface and the photoresist layer, and directing light with a wavelength of less than 450 nm through the water and onto the photoresist.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
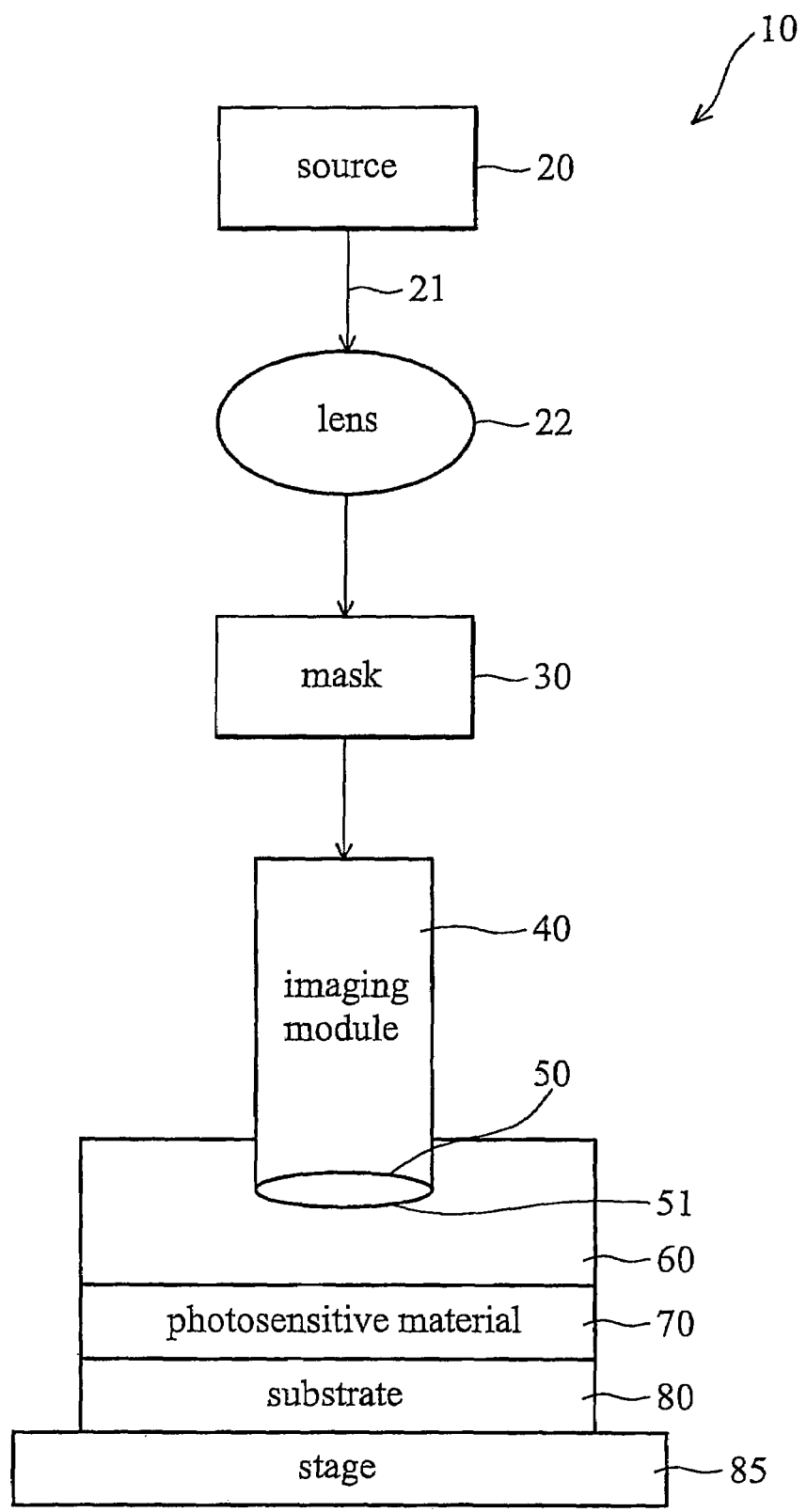
FIG. 1 illustrates a simplified diagram of an immersion lithography system.

In an exemplary embodiment of the present invention, shown in FIG. 1, an immersion lithographic system 10 contains a source 20 emitting a beam of optical energy 21 through a lens 22. The energy is then passed through a mask 30 and an imaging module 40, and a final lens 50 having an optical surface 51. In specific embodiments, the lens 50 can be formed from silicon oxide (or another material including silicon and oxygen), fused silica or calcium fluoride, as examples. In one example, the light source 20 can project light having a wavelength of less than or equal to about 193 nm (e.g., at 157 nm or 193 nm). Preferably, the light has a wavelength of less than 450 nm.

System 10 employs an immersion fluid 60 between final optic lens 50 and a portion of semiconductor substrate 80 to be illuminated. The portion of the semiconductor substrate to be illuminated has an overlying photosensitive material or photoresist 70, so that the immersion fluid is in direct contact with the photosensitive material or photoresist. As shown, a stage 85 may be used to secure the substrate 80.

The immersion fluid 60 is preferably a liquid that includes water. For example, the fluid can be purified water or deionized water. In another embodiment, the fluid 60 can include cyclo-otance or perfluoropolyether, or alone or in combination with other fluids.

The photoresist 70 may, for example, be a positive photoresist which comprises polymer structures that become soluble in a developer solution after being exposed to light and that are insoluble in a developer solution when not exposed to light. For positive photoresists, a developer solution such as tetramethylammonia hydroxide (TMAH) solution that dissolves the exposed photoresist without substantially affecting the unexposed photoresist or intact polymer may be used.

In the preferred embodiment, the substrate 80 is a semiconductor substrate that is being used to fabricate integrated circuits. For example, the substrate 80 can be a silicon substrate (e.g., monolithic silicon substrate or a silicon-on-insulator substrate) in which transistors (and other components) are formed. These components may be interconnected with metal layers.

The photosensitive material 70 can be a photoresist or other masking material. In the preferred embodiment, the material 70 can be patterned in very small dimensions. For example, polysilicon (or other conductive material) lines can be etched in alignment with the patterns in the material 70 to create, for example, metal-oxide-semiconductor (MOS) gates having lengths of 50 nm or less. As another example, metallization lines (e.g., copper damascene) can be formed within trenches formed in dielectric layers. For example, a dielectric layer (not shown) such as silicon oxide (e.g., $SiO_2$, FSG, PSG, BPSG) can be deposited over the wafer 80. Using the photosensitive material 70 as a mask, trenches (not shown) can be formed within the dielectric layer and filled with a conductor, which is then planarized.

Figure 2A:
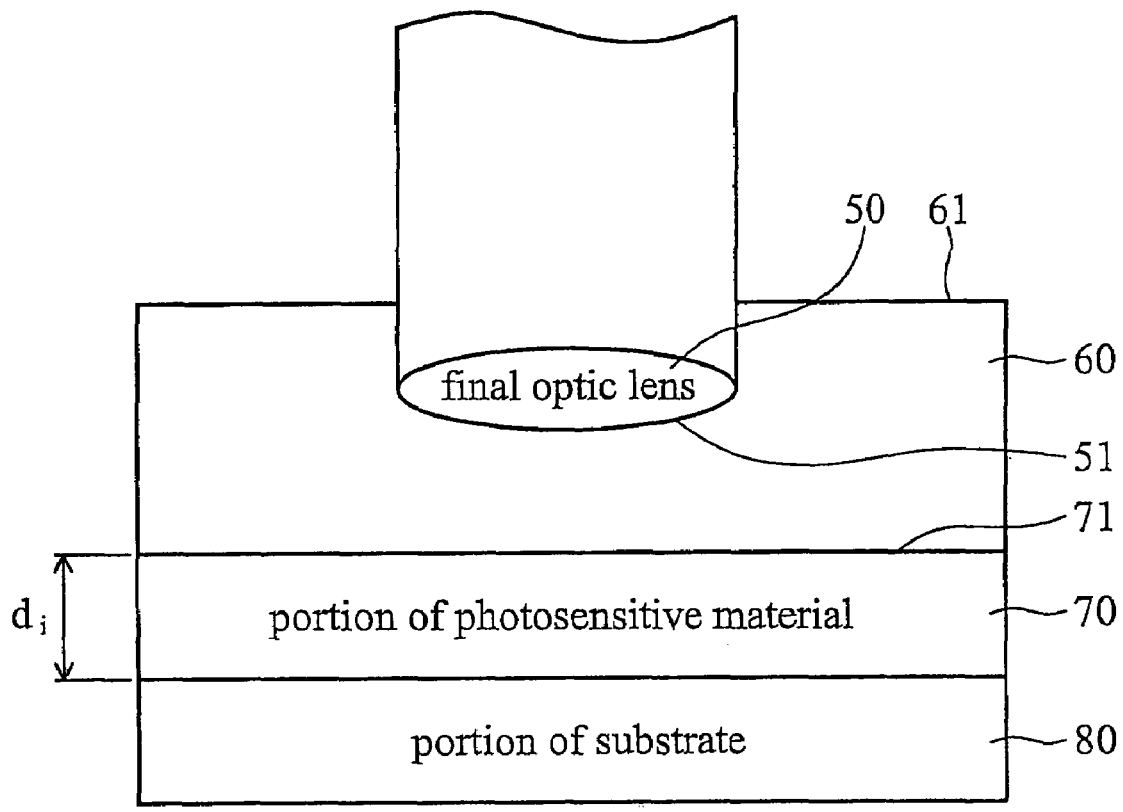
FIGS. 2a, 2b, and 2c illustrate the diffusion of an immersion fluid into photosensitive material.
Figure 2B:
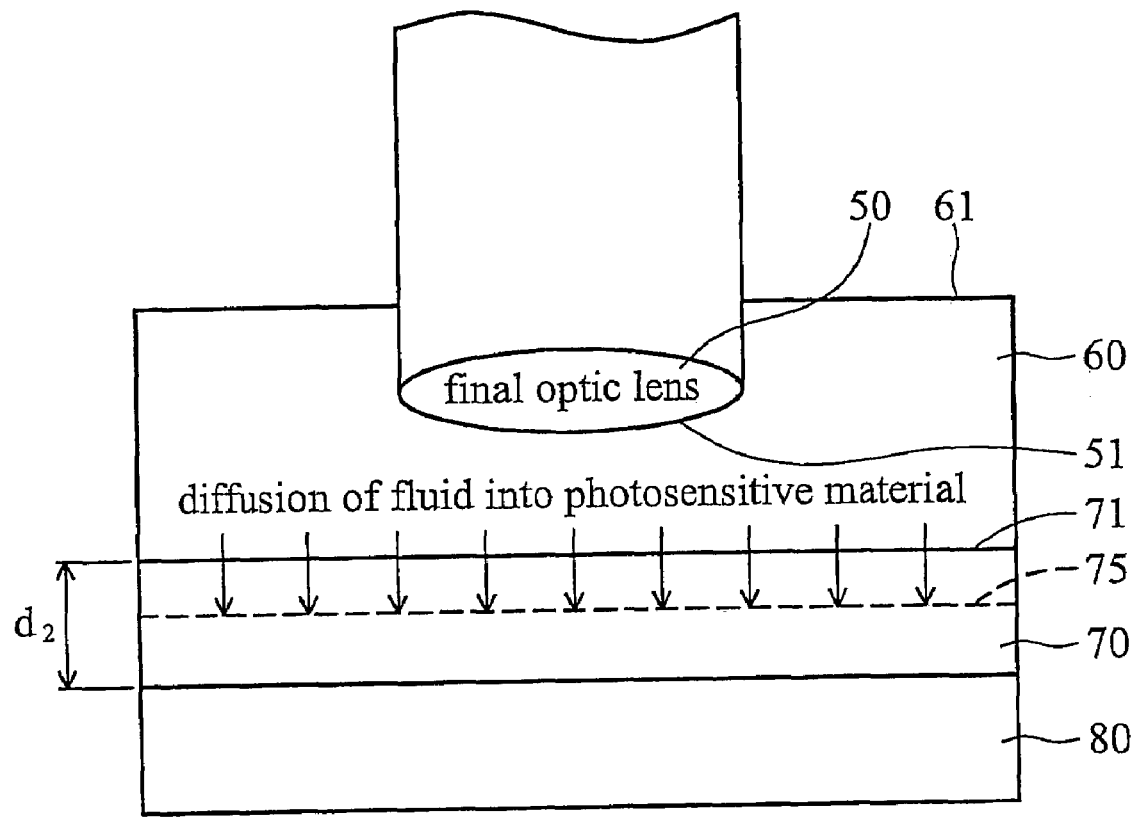
Figure 2C:
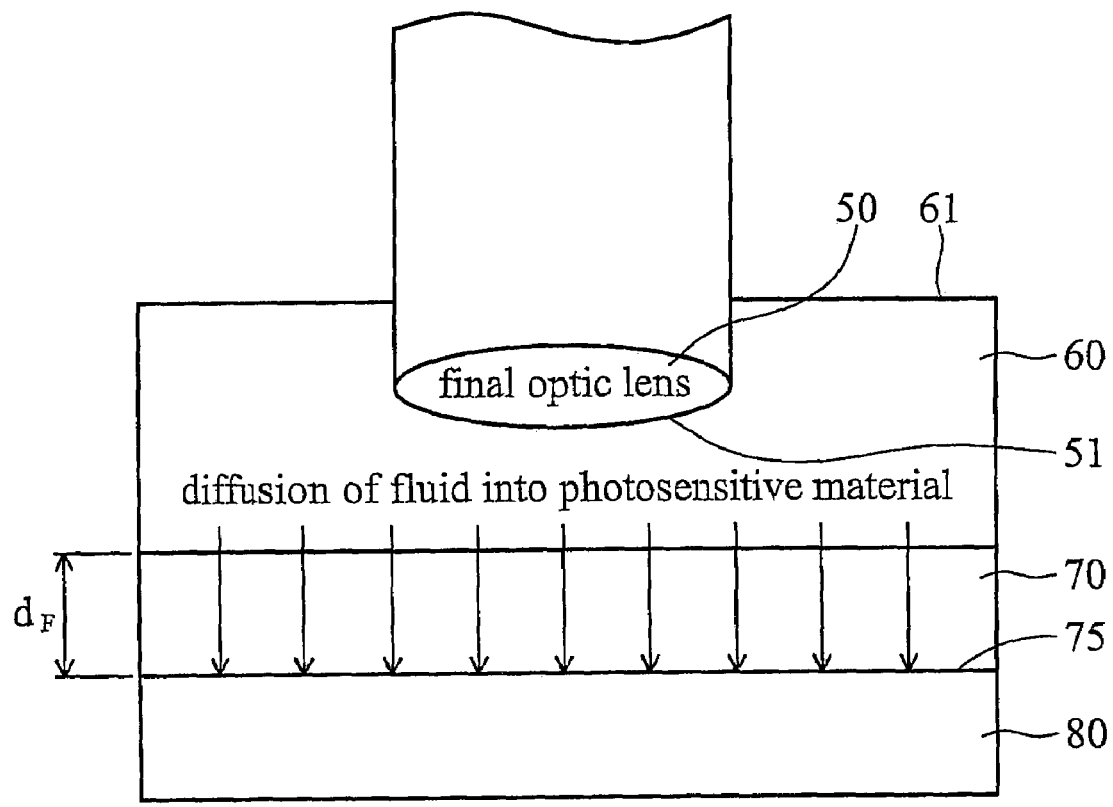

Referring now to FIGS. 2a, 2b and 2c, the diffusion of an immersion fluid into the photosensitive material 70 is illustrated. The immersion fluid 60, having a top surface 61, is in contact with the photosensitive material 70 at an interface 71, as shown in FIG. 2a. The final optic lens 50 is in contact with the immersion fluid 60. The immersion fluid is preferably water, but it is understood that other immersion fluids such as cyclo-octane and perfluoropolyether (PFPE) may be used. The photosensitive material 70 has an original thickness $d_i$ when formed on the substrate 80. When a portion of the photosensitive material 70 is exposed to photons of a predetermined dose, a photo-generated catalyst is formed in the exposed portion of the photosensitive material. Photo-generated catalysts are employed in chemically amplified (CA) photoresists, which are widely used in lithography using 193 nm and 157 nm wavelengths.

When the immersion fluid 60 is first introduced onto the photosensitive material 70, i.e., at a time equal to zero, the thickness of the photosensitive material 70 is unchanged at $d_i$, as shown in FIG. 2a. The immersion fluid 60 then diffuses into the photosensitive material 70. The speed at which the immersion fluid 60 diffuses into the photosensitive material 70 depends on the type of immersion fluid 60 used and the type of photosensitive material 70 used. Nevertheless, this diffusion of immersion fluid 60 into the photosensitive material 70 occurs to a lesser or greater extent depending on the choice of the immersion fluid 60 and the photosensitive material 70.

Diffusion of immersion fluid 60 into the photosensitive material 70 may result in swelling of the photosensitive material 70, as shown in FIG. 2b. In FIG. 2b, the diffusion front 75 is depicted as a dotted line. The portion of the photosensitive material 70 above the diffusion front 75 (dotted line) swells and contributes to an increase in the thickness of the photosensitive material 70. As depicted in FIG. 2b, the total thickness of the photosensitive material 70 has swelled to a thickness of $d_2$ from its original thickness $d_i$.

Further diffusion of the immersion fluid 60 into the photosensitive material 70 pushes the diffusion front 75 further down and the swelling increases with more diffusion or with the length of time the photosensitive material 70 remains in the immersion fluid 60. When the diffusion front 75 reaches the interface between the photosensitive material 70 and the substrate 80, as depicted in FIG. 2c, the swelling in the thickness of the photosensitive material 70 reaches a maximum. At this point, the thickness has swelled to $d_f$, and no significant further swelling occurs.

Figure 3:
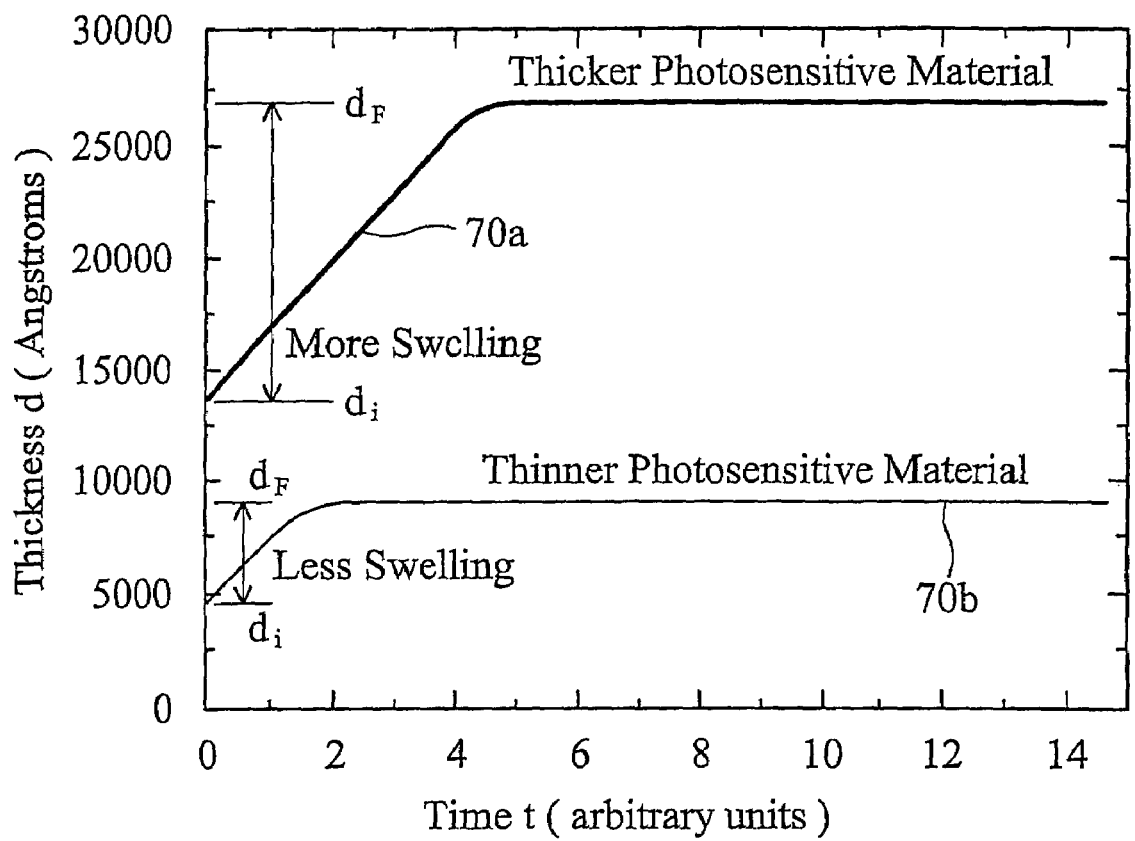
FIG. 3 illustrates the thickness of a photosensitive material as a function of time as the photosensitive material swells.

In accordance with an embodiment of the present invention, the thickness of a photosensitive material 70 immersed in an immersion fluid increases with time according to the graph of FIG. 3. In FIG. 3, the thicknesses of both a thicker photosensitive material 70a and a thinner photosensitive material 70b immersed in an immersion fluid are plotted as a function of the immersion time. At a zero immersion time, the photosensitive material has an initial thickness, referred to here as $d_i$. As time increases from time equal to zero, the thickness increases linearly with time, during which the immersion fluid progressively seeps into the photosensitive material and diffuses downwards towards the interface between the photosensitive material and the substrate. For example, when the diffusion front reaches the interface between the photosensitive material and the substrate after a total immersion time of approximately 5 for the thicker photosensitive material 70a, the photosensitive material reaches a final thickness, referred to here as $d_f$. FIG. 3 shows time in a scale of arbitrary units. In a realistic system, each unit of time in FIG. 3 could be equal to from just over 0 seconds to about 60 seconds.

In accordance with an embodiment of the present invention, the difference between the final thickness $d_f$ and $d_i$ is the amount of swelling, and the swelling is larger for a thicker photosensitive material. Therefore, a thicker photosensitive material is more susceptible to problems associated with swelling. In accordance with an embodiment of the present invention, a thinner photosensitive material swells to a lesser extent and takes a shorter time to do so. That is, a thinner photosensitive material reaches the final thickness within a shorter immersion time duration. Diffusion of the immersion fluid into the photosensitive material may result in alteration of the properties of the photosensitive material. For example, properties such as thickness may be increased with a longer immersion time.

Figure 4:
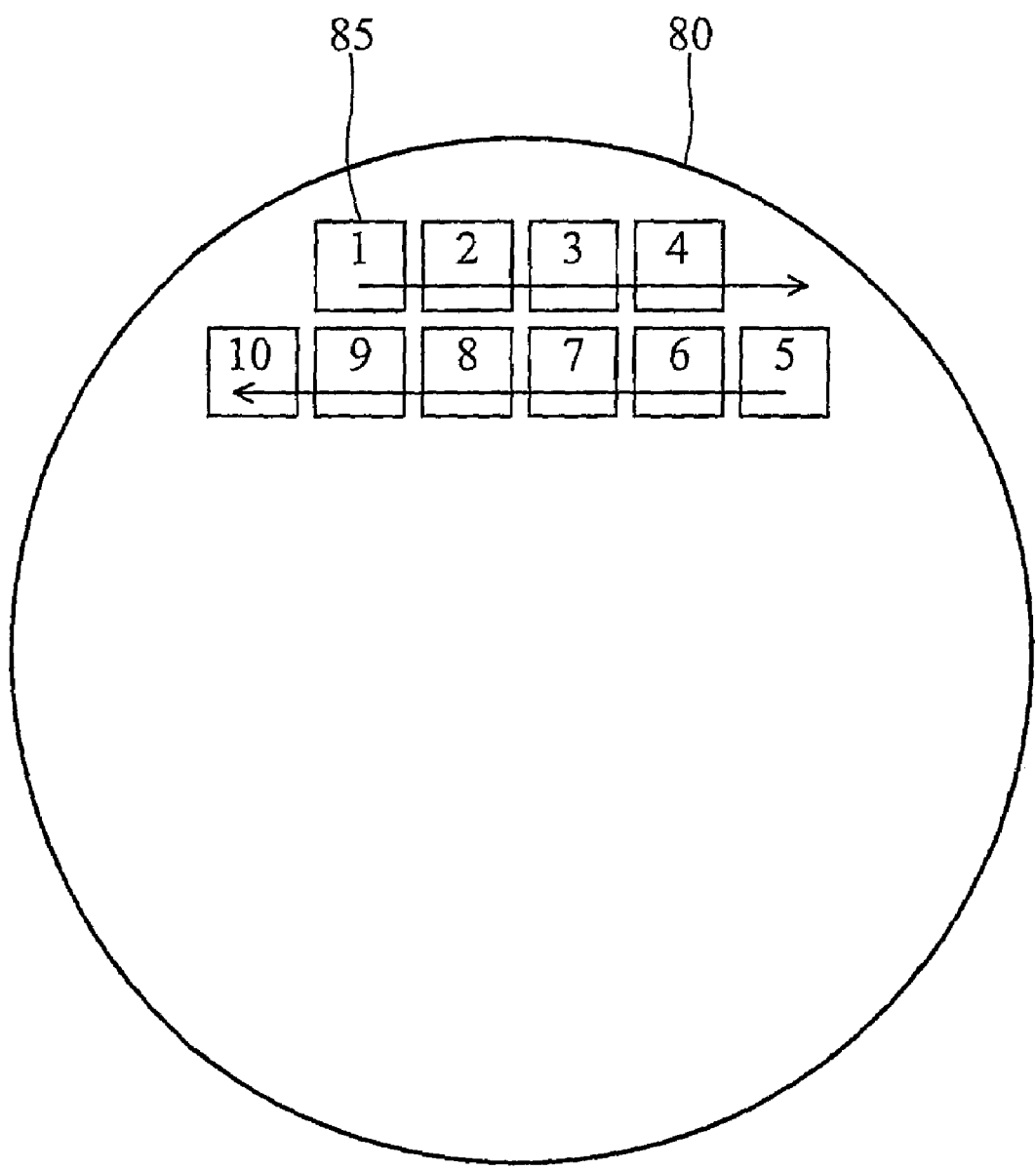
FIG. 4 illustrates how blocks immersed in immersion fluid are exposed at different times.

A semiconductor substrate or a wafer 80 typically contains blocks (e.g., dies or groups of dies) 85 repeated throughout the substrate as shown in FIG. 4. In a preferred embodiment, each block 85 may contain one or more integrated circuits. When defining patterns for the integrated circuits on the wafer 80, the lithographic system typically exposes one block 85 at a time using a common 'step-and-expose' scheme. For example, a block labeled '1' is first exposed, and the lithographic system steps to the next block labeled '2' for the next exposure, and so on. The 'step-and-expose' scheme usually proceeds in a raster scan manner, as indicated by the arrows in FIG. 4. When the 'step-and-expose' scheme is applied to an immersed substrate or wafer, the block labeled '1' may be exposed at time equal to $t_1$, the block labeled '2' may be exposed at time equal to $t_2$, and so on. This means that blocks generally would be exposed when the photosensitive material on the blocks have swelled to different extents.

In accordance with an embodiment of the present invention, it is preferable that the photosensitive material 70 on all blocks on a substrate 80 swell to the same extent when each block 85 is exposed. The reason is that this helps to ensure improved uniformity and enhanced manufacturability. One way to ensure that the photosensitive material 700n all blocks 85 swell to the same extent when each block is exposed is to use a sufficiently thin photosensitive material. As shown in FIG. 3, a thin photosensitive material 70 swells less and achieves a final thickness after a shorter time. By using a sufficiently thin photosensitive material 70, the final thickness $d_f$ can be achieved even when the first block on the substrate is exposed.

In the examples shown in FIG. 3, the photosensitive materials 70a and 70b swell to a final thickness that is about 100% thicker than the initial thicknesses. The amount of swelling, i.e., $d_f-d_i$, for exemplary photosensitive material 70b as a function of its initial thickness $d_i$ is plotted as a line labeled by 'Material 1' in FIG. 5. A different photosensitive material that swells less for a given initial thickness can be used. For example, by adjusting the polymer composition of the photosensitive material 70, the final amount of swelling can be changed or advantageously reduced.

Figure 5:
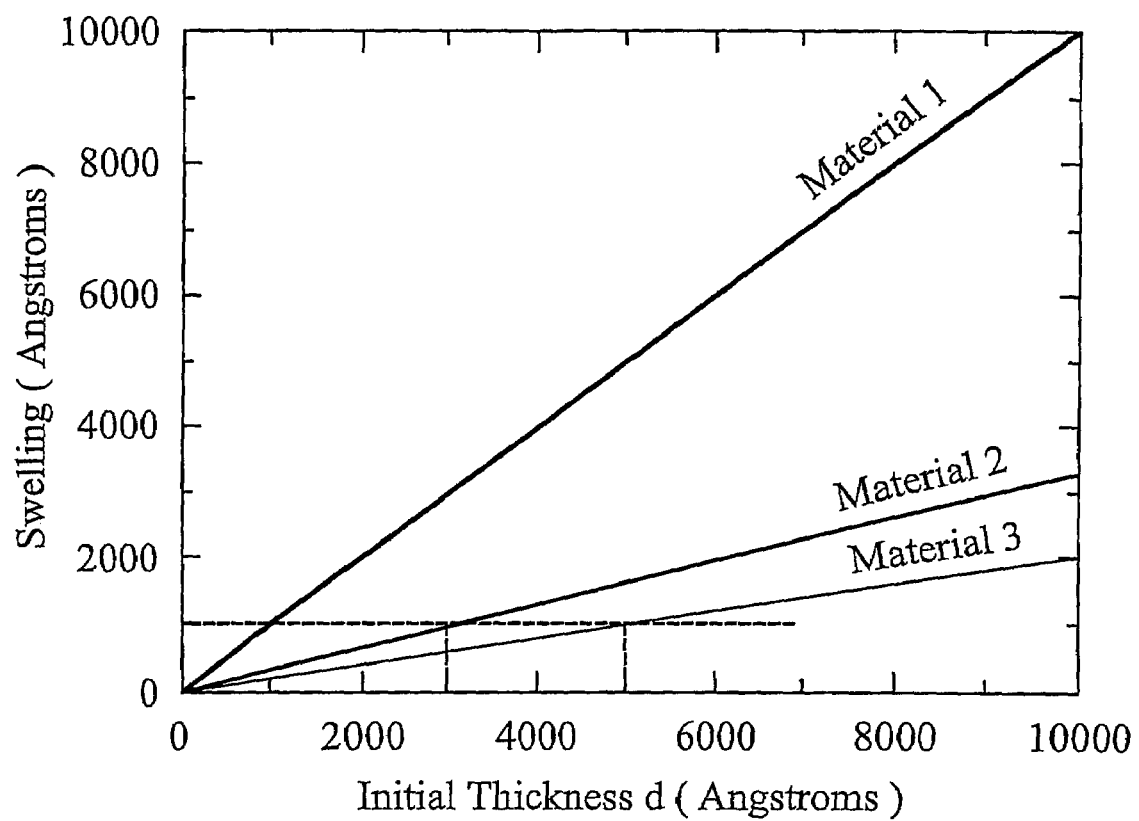
FIG. 5 illustrates the swelling of several photosensitive materials as a function of initial thickness of the photosensitive materials.

In FIG. 5, Material 2 swells to a lesser extent than Material 1 and Material 3 swells to a lesser extent than Material 2, for a given initial thickness $d_i$. In accordance with an embodiment of the present invention, the amount of swelling ($d_f-d_i$) is to be limited to about 1000 angstroms so that the depth of focus of the lithographic system is not compromised. In a preferred embodiment, the thickness of the photosensitive material 70 is preferably less than about 5000 angstroms, more preferably less than about 3000 angstroms, and even more preferably less than about 1000 angstroms.

The same concept may be applied from another perspective. For example, the property of the photosensitive material 70 considered is not swelling but sensitivity of the photosensitive material to a specific dose of photons or exposure. The sensitivity of the photosensitive material to a specific dose of exposure may be changed with increasing the amount of immersion fluid 60 present in the photosensitive material 70. When a saturated amount of the immersion fluid is present in the photosensitive material, no further change in the sensitivity of the photosensitive material occurs. By using a thinner photosensitive material, the saturated amount of immersion fluid will be present in the photosensitive material after a shorter time, even before the exposure of the first block on the substrate. This helps to ensure uniformity of the pattern exposure from block to block.

After exposing the photosensitive material 70 on the blocks 85, the photosensitive material 70 is then developed, for example, in a tetramethylammonia hydroxide (TMAH) solution, resulting in dissolution of the exposed portions of the photosensitive material.

Figure 6:
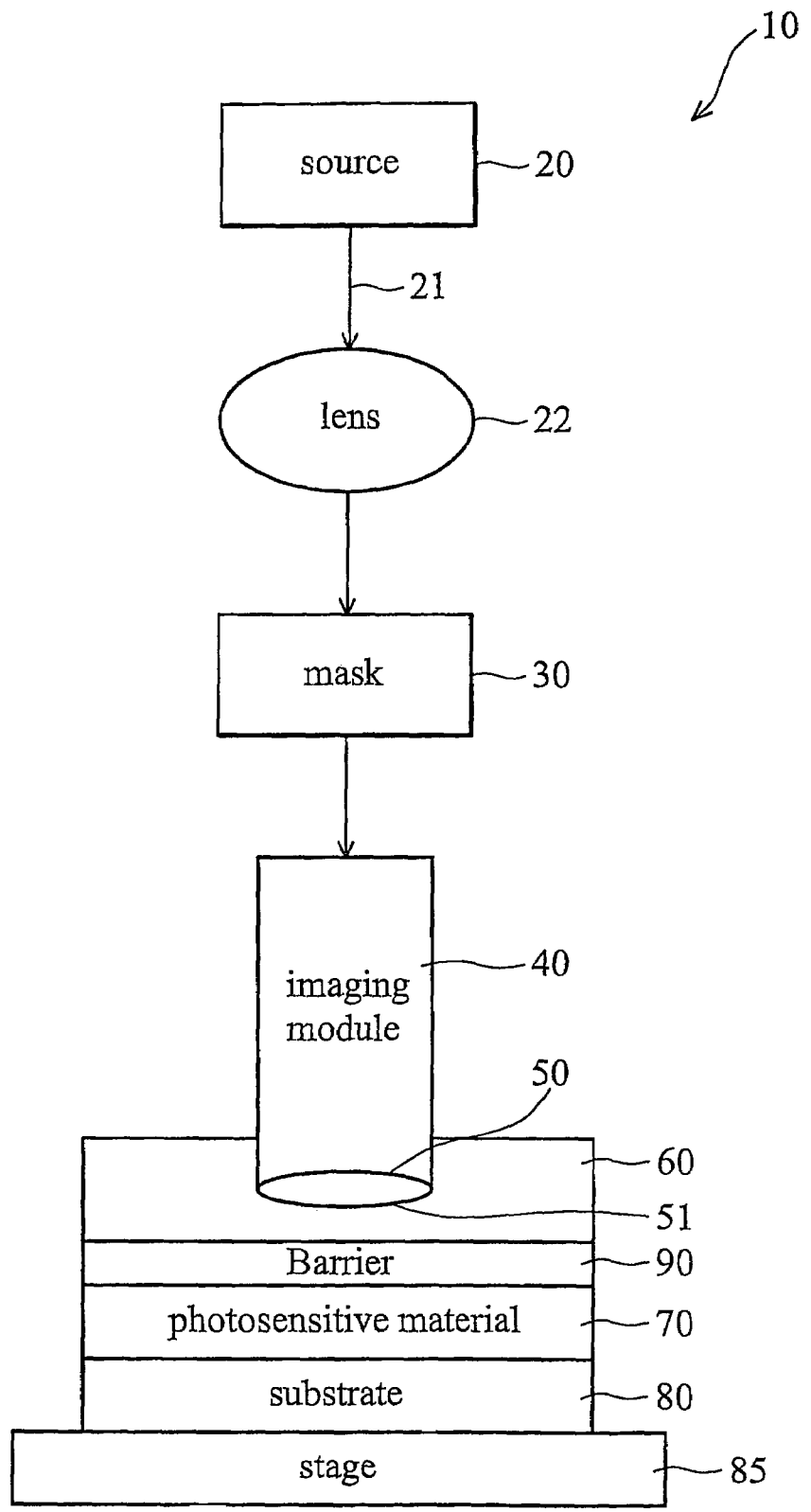
FIG. 6 shows a barrier layer of material over a photosensitive material to limit or restrict diffusion of an immersion fluid.

Another way to reduce the problem of swelling of photosensitive material is to employ a barrier layer 90 of material over the photosensitive material 70, as shown in FIG. 6. The purpose of the barrier layer 90 is to limit or restrict the diffusion of the immersion fluid 60 into the photosensitive material 70. The barrier layer 90 may or may not be photosensitive. In one embodiment, the barrier layer 90 may be a separate layer of material that is substantially impervious or impermeable to the immersion fluid 60. For example, in the case where the immersion fluid 60 is water, the barrier layer 90 may comprise a hydrophobic material so that the barrier layer has a hydrophobic surface that prevents excessive diffusion of water into the barrier layer and the photosensitive material.

In another embodiment, the barrier layer 90 may be formed from the photosensitive material 70, for example by a treatment of the photosensitive material or a treatment of the surface of the photosensitive material. The treatment can be a chemical treatment, such as an exposure of the photosensitive material to a plasma environment, an oxidizing environment, or any other chemical environment. The treatment can also be an ion implantation process. Further, the treatment can be a thermal treatment, for example, in an inert ambient. It is understood that the barrier layer may be used in conjunction with a reduced thickness of photosensitive material to further reduce the amount of swelling.

It should be noted that the immersion lithographic system as described above may employ various versions of immersion lithography that are already known. For example, the system may employ local immersion where the immersion fluid is disposed between the final optic lens and a portion of the wafer to be exposed. In another example, the system may employ wafer immersion where the entire wafer is immersed in the immersion fluid. In yet another example, the system may employ stage immersion where the entire stage 85 is immersed in the immersion fluid.

Another solution to the uniformity problem is to find a resist that reaches its maximum swelling very quickly. The process here would be to immerse, wait until the maximum swelling is achieved, and then expose. From the perspective of achieving good uniformity, it is desirable that the photoresist either swell minimally and quickly, or does not to swell at all (e.g., one goal of the use of barrier material 90). Accordingly, processing the photoresist to swell to the maximum thickness quickly would be desirable. For example, this 'processing' could aim to increase the permeability of the photoresist to the immersion fluid.

While several embodiments of the invention, together with modifications thereof, have been described in detail herein and illustrated in the accompanying drawings, it will be evident that various modifications are possible without departing from the scope of the present invention. The examples given are intended to be illustrative rather than exclusive.

What is claimed is:

1. A method for illuminating a semiconductor structure having a topmost photoresist layer, the method comprising:
   providing the semiconductor structure having the photoresist layer, the photoresist layer having a thickness of less than 5000 angstroms;
   introducing an immersion fluid into a space between an optical surface and the photoresist layer; and
   directing optical energy through the immersion fluid and onto the photoresist layer, the directing not being started until after the immersion fluid has diffused into the photoresist layer to reach an interface between the photoresist layer and the semiconductor structure.

2. The method of claim 1 wherein the immersion fluid comprises water.

3. The method of claim 1 wherein the optical energy comprises light having a wavelength of less than about 450 nm.

4. The method of claim 1 wherein the optical surface comprises silicon oxide.

5. The method of claim 1 wherein the optical surface comprises calcium fluoride.

6. The method of claim 1 wherein the photoresist layer comprises a chemically amplified photoresist layer.

7. The method of claim 1 wherein the immersion fluid is in contact with a portion of the photoresist layer.

8. The method of claim 1 wherein the semiconductor structure is immersed in the immersion fluid.

9. The method of claim 1 further comprising a stage underlying the semiconductor structure.

10. The method of claim 9 wherein the stage is immersed in the immersion fluid.

11. The method of claim 1 further comprising developing the photoresist layer.

12. The method of claim 11 wherein developing the photoresist layer comprises immersing the photoresist layer in a tetramethylammonia hydroxide solution.

13. A method of fabricating a semiconductor device, the method comprising:
    providing a semiconductor wafer;
    forming a photoresist layer over the semiconductor wafer, the photoresist layer having a thickness of less than about 5000 angstroms;
    introducing an immersion fluid into a space between an optical surface and the photoresist layer, the immersion fluid contacting the photoresist layer and being diffused substantially throughout the photoresist layer;
    patterning the photoresist layer by directing optical energy through the immersion fluid and onto the photoresist layer, the patterning not being performed until after the immersion fluid is diffused substantially throughout the photoresist layer;
    removing portions of the photoresist layer in accordance with a pattern from the patterning step; and
    processing the semiconductor wafer using remaining portions of the photoresist layer as a mask.

14. The method of claim 13 wherein the immersion fluid comprises water.

15. The method of claim 13 wherein the optical energy comprises light having a wavelength of less than 450 nm.

16. The method of claim 13 wherein the optical surface comprises silicon oxide.

17. The method of claim 13 wherein the optical surface comprises calcium fluoride.

18. The method of claim 13 wherein the photoresist layer comprises a chemically amplified photoresist layer.

19. The method of claim 13 wherein the semiconductor wafer is immersed in the immersion fluid.

20. The method of claim 13 further comprising placing the semiconductor wafer on a stage.

21. The method of claim 20 wherein the stage is immersed in the immersion fluid.

22. The method of claim 13 further comprising developing the photoresist layer.

23. The method of claim 22 wherein the step of developing the photoresist layer comprises immersing the photoresist layer in a tetramethylammonia hydroxide solution.

24. The method of claim 23 wherein the optical energy has a wavelength of less than 450 nm.

25. The method of claim 13 wherein providing the semiconductor wafer comprises providing a semiconductor wafer with a layer of material deposited thereon, wherein forming the photoresist layer comprises forming a photoresist layer over the layer of material, and wherein processing the semiconductor wafer comprises etching the layer of material.

26. The method of claim 25 wherein the layer of material comprises a conductive layer.

27. The method of claim 26 wherein processing the semiconductor wafer comprises etching the conductive layer into gate electrodes.

28. The method of claim 27 wherein each gate electrode has a minimum dimension of 50 nm or less.

29. The method of claim 25 wherein the layer of material comprises a dielectric layer.

30. The method of claim 29 wherein processing the semiconductor wafer comprises forming trenches in the dielectric layer, the method further comprising filling the trenches with a conductor.

* * * * *